United States Patent
Baalu et al.

(10) Patent No.: US 6,442,494 B1
(45) Date of Patent: Aug. 27, 2002

(54) METHOD AND CIRCUIT FOR DETECTING BATTERIES IN A DISTRIBUTED BATTERY NETWORK

(75) Inventors: Arvin Baalu, Sterling Hts.; David Lowell Miller, Canton; Edward Robert Ahlquist, Jr., Troy; Maher El-Jaroudi; Paul William Keberly, both of Canton, all of MI (US)

(73) Assignee: Autoliv ASP, Inc., Ogden, UT (US)

(*) Notice: Subject to any disclaimer, the term of this patent is extended or adjusted under 35 U.S.C. 154(b) by 0 days.

(21) Appl. No.: 09/510,850

(22) Filed: Feb. 23, 2000

(51) Int. Cl.[7] .............................................. G01R 31/28
(52) U.S. Cl. ......................................... 702/63; 324/528
(58) Field of Search .............................. 702/63, 60–62, 702/116–118, 121, 119, 59, 58; 327/116, 119, 120; 324/100, 512, 528

(56) References Cited

U.S. PATENT DOCUMENTS

| | | | |
|---|---|---|---|
| 4,313,079 A | * 1/1982 | Lee | 320/DIG. 21 |
| 5,204,669 A | 4/1993 | Dorfe et al. | |
| 5,666,040 A | * 9/1997 | Bourbeau | 320/118 |
| 5,680,113 A | 10/1997 | Allen et al. | |
| 5,701,068 A | * 12/1997 | Baer et al. | 320/119 |
| 5,745,493 A | 4/1998 | St. Clair | |
| 5,768,277 A | 6/1998 | Ohno et al. | |
| 5,850,351 A | 12/1998 | Lofty et al. | |
| 6,031,354 A | * 2/2000 | Wiley et al. | 320/116 |

* cited by examiner

Primary Examiner—Marc S. Hoff
Assistant Examiner—Edward Raymond
(74) Attorney, Agent, or Firm—Sally J. Brown

(57) ABSTRACT

A distributed battery control network (14) for a battery string (12) has a plurality of sensing modules (SM) each associated with one of the batteries in the battery string (12). Each of the sensing modules has a respective sequencing input (SI) and a sequencing output (50). Said plurality modules have a sequencing input with a predetermined signature type, storing said address in a particular one of said plurality modules with said sequencing input equal to said signature type, and generating an identifying signature at an output of said particular one of plurality modules with said sequencing input equal to said signature type. A network (22) is coupled to each of the sending modules. A controller (24) is coupled to the bus and communicates with each of the sensing modules. The controller (24) loads each of the sensing modules with an address and a signature type.

20 Claims, 2 Drawing Sheets

METHOD AND CIRCUIT FOR DETECTING BATTERIES IN A DISTRIBUTED BATTERY NETWORK

TECHNICAL FIELD

The present invention relates generally to battery strings particularly for use in electric vehicles, and more particularly, to a method and circuit for detecting the position of a battery within a string relative to the other batteries in the string.

BACKGROUND

In electric vehicles or hybrid electric vehicles, high voltage battery packs or battery strings are used to provide electric power to the powertrain of the vehicle. High voltage battery packs typically comprise a plurality of lower voltage batteries connected in series. At times, the batteries are charged and discharged. Eventually, over extended use, the performance of one or more batteries of the string may degrade. For example, this may be manifested in a failure to hold a charge in a similar manner to the other batteries in the string. Eventually, the particular battery may require servicing.

In order to provide service for a particular battery in the battery string, it is desirable to identify the particular battery subject to degradation. In many current systems, a service technician, through trial and error testing of the individual batteries, is used to identify the degraded battery. This process is time and labor intensive because this often means removal of the battery from the system may be performed.

In U.S. Pat. No. 5,850,351, a distributed management apparatus for a battery pack is described that has battery monitoring modules for each battery. All of the battery monitoring modules are identified by an address. However, this system does not identify the relative position of each individual battery with respect to the others. Identity in the '351 patent merely identifies the presence of a particular battery module rather than its relative position within the battery pack.

It would therefore be desirable to provide a battery pack control system wherein the relative position of each battery is recorded so that upon the degradation of operation of a particular battery, that battery may be easily removed and replaced from the battery pack.

SUMMARY OF THE INVENTION

It is therefore one object of the invention to provide a distributed battery control system that allows the relative location of each battery in the string to be identified.

In one aspect of the invention, a distributed battery control network for a plurality of batteries comprises a plurality of sensing modules. One of each of the plurality of sensing modules is associated with a respective one of said plurality of batteries. Each sensing module has a sequencing input and a sequencing output. A bus interconnects the plurality of sensing modules. A controller is coupled to the bus and communicates with each of the sensing modules via a network.

In a further aspect of the invention, a method for identifying batteries in a distributed battery control network comprises the steps of:

providing a string of a predetermined number of batteries having said predetermined number of sensing modules associated therewith, each battery having a respective sensing module;

determining the relative location of each battery and sensing module within the string; and assigning a unique address to each sensing module.

One advantage of the invention is that by knowing the location of the battery better control and diagnostics of the battery string may be achieved. Another advantage of the invention is that by knowing a position of a suspect battery, service personnel may easily locate the suspect battery so that it may be quickly replaced. This reduces time and therefore reduces cost in replacing a battery.

Other objects and features of the present invention will become apparent when viewed in light of the detailed description of the preferred embodiment when taken in conjunction with the attached drawings and appended claims.

DETAILED DESCRIPTION OF THE PREFERRED EMBODIMENT

Figure 1:
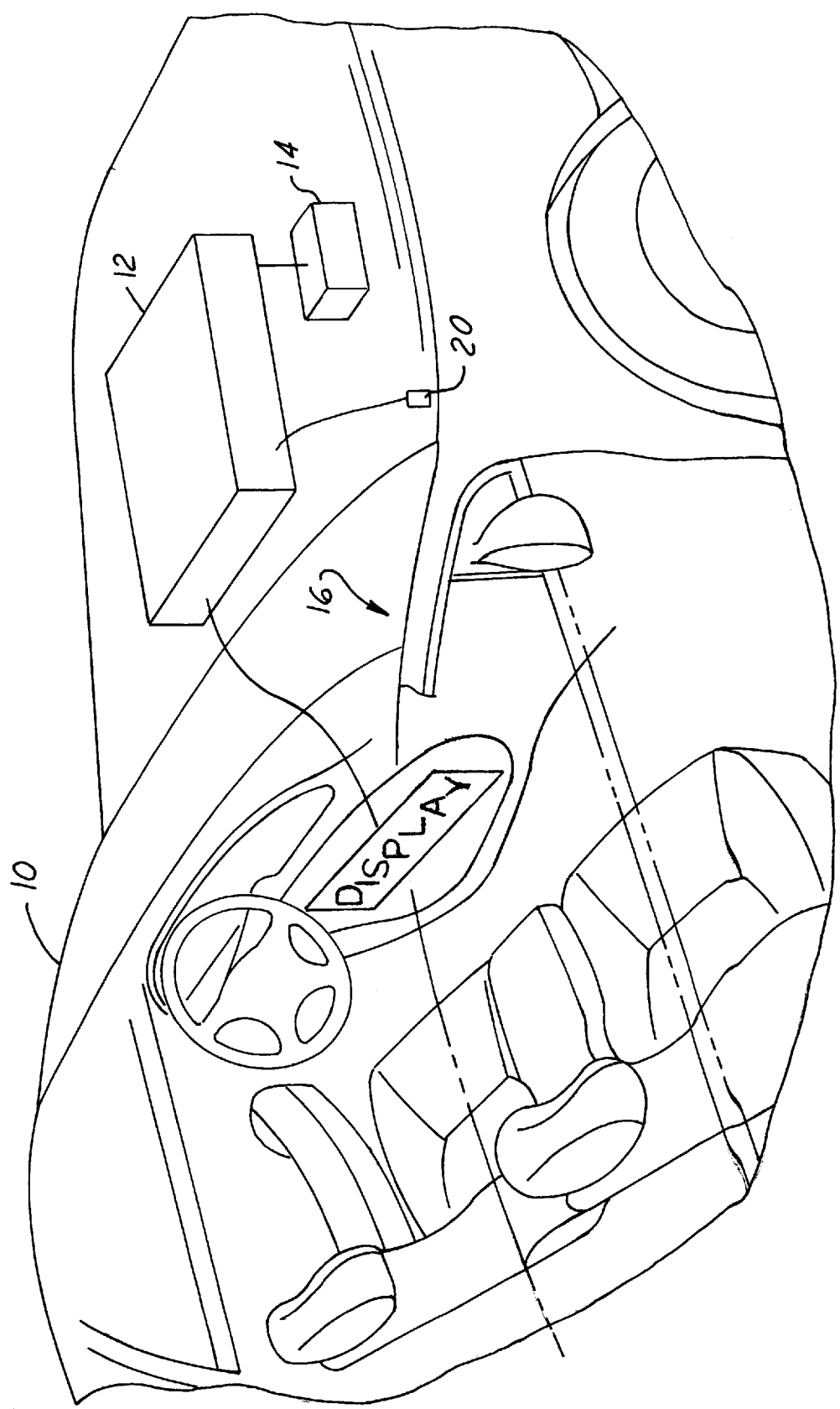
FIG. 1 is a perspective view of an automotive vehicle having a distributed battery control network according to the present invention.

In the following figures, the same reference numerals are used to identify the same components in the various views. The present invention is described with respect to an electric vehicle. However, those skilled in the art would recognize that the present invention is applicable to various types of electric vehicles including hybrid electric vehicles that run on both electricity and internal combustion engine power. Also, the present invention is suitable for use in various types of automotive vehicles including but not limited to cars, trucks, and trains and in non-automotive uses requiring a battery string.

Referring now to FIG. 1, an automotive vehicle 10 has a battery string 12 therein. The battery string 12 is used to provide electric power to the powertrain of the vehicle. A distributed battery control network 14 is coupled to battery string 12 and may provide many functions including charging of the battery string 12. The distributed battery control network 14 is also used to provide identification of the relative positions of each of the batteries within the battery string 12. An interface 16 may include a display 18 or a diagnostic connector 20. Interface 16 identifies to the driver or a service technician of the operation of the batteries within the battery string 12. For example, display 18 signal the operator of the vehicle that service of the battery string is required. Display 18 may also be used to provide the vehicle operator or service technician with the identity of a suspected performance degraded battery. Display 18 may include an indicator light or warning buzzer or a LCD display message on an instrument panel of the vehicle. Likewise, a diagnostic connector 20 may be used to couple to a service diagnostic testing device to indicate to a service technician which of the batteries in the battery string 12 are suspect. Other information may be included as part of the information through connector 20. Of course, those skilled in the art would recognize that various types of interfaces may be used. Also, both display 18 and diagnostic connector 20 may be implemented.

Figure 2:
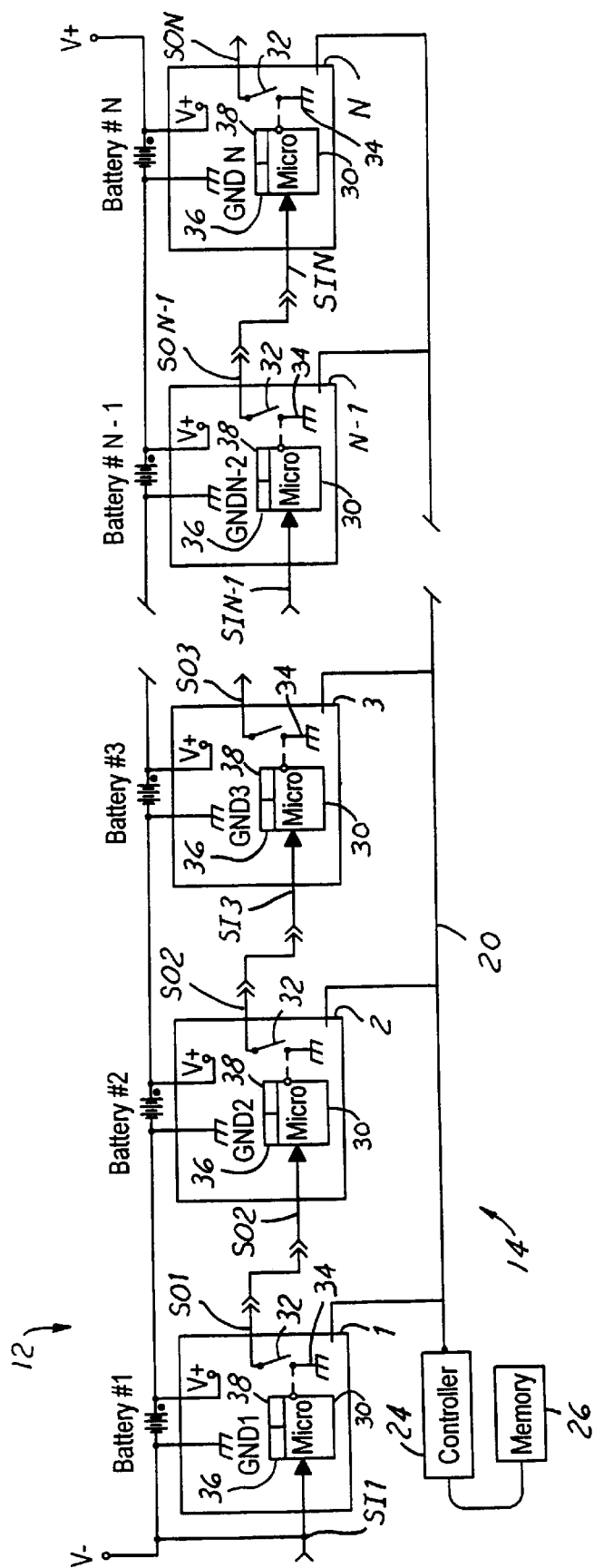
FIG. 2 is a schematic view of a control network according to the present invention.

Referring now to FIG. 2, a battery string 12 and distributed battery control network 14 are shown in further detail. Battery string 12 is comprised of a known number of batteries. The number of batteries depends on the desired output of the system and will vary depending on the particular vehicle. In one application, for example, 39 batteries are coupled together. As illustrated, however, for illustrative purposes, N batteries are shown. Battery 1, battery 3, battery N−1, and battery N. In this arrangement battery 1 is the first battery, battery N is the last battery in the string, and batteries 2 through N−1 are intermediate batteries. Each battery has a positive voltage terminal V+ and a negative ground terminal. Batteries battery 1 through battery N are coupled in series. That is, the negative terminal of each battery is coupled to the positive terminal of the adjacent battery, except for battery 1 whose negative terminal provides the overall B− terminal of the battery string 12 and battery N whose positive terminal provides the B+ terminal for the battery string 12.

Distributed battery control network 14 has a sensing module (SM) for each battery. That is, sensing module SM 1 is coupled to battery 1, sensing module SM 2 is coupled to battery 2, sensing module SM 3 is coupled to battery 3, sensing module SM N−1 is coupled to battery N−1 and sensing module SM N corresponds to battery N.

Each sensing module SM 1 through SM N is coupled to a communication network 22. Communication network 22 may be one of a various number of types of networks. In the preferred embodiment, a two-wire communication network is employed. Communication network 22 couples each sensing module to a controller 24. Controller 24 is preferably microprocessor-based and may perform various functions including assigning addresses and recording the relative position of each sensing module within battery string 12. Of course, other monitoring and control functions may be performed. Controller 24 may have a memory 26 for storing the addresses and corresponding locations therein.

Each sensing module SM 1 through SM N has a microprocessor 30 therein. Microprocessor 30 is coupled to network 22. Microprocessor 30 may have a number of battery monitoring functions that are beyond the identification function as would be evident to those skilled in the art. Each microprocessor 30 is coupled to a sequencing input SI and has an output that is coupled to the sequencing output SO of its respective sensing module. Each sensing input and sensing output is hereafter referred to as SI# or SO# respectively, where # is the sensing module number. The output of microprocessor 30 is coupled to a controllable switch 32. As will be further described below, microprocessor 30 may be used to open and close switch 32 in a desirable manner or provide other suitable outputs from its respective sensing module. Switch 32 may be coupled to a ground terminal 34, to a voltage within the sensing module, or to an output of microprocessor 30. Upon operation of switch 32, sequencing output may oscillate between the voltage and ground signal to provide a square wave output.

Each sensing module is coupled to its adjacent modules. That is, the sequencing output SO is coupled to the sequencing input of the adjacent module. This is true except for sensing module SM 1 whose sequencing input is coupled to B− and for SM N whose sequencing output may be left floating.

Each sensing module has an address memory 36 and a signature memory 38. Address memory 36 is used to store a unique address for the module (and therefore the battery) that is assigned by controller 24. Signature memory 38 stores the signature type for which the module is looking.

Each sequencing module has a V+ terminal coupled to the positive terminal of the associated battery and a ground terminal (GND) coupled to the negative terminal of its associated battery.

In operation, the batteries with associated sensing modules are assembled into the battery string 12. Each sensing module may have a previously stored address contained therein. In this method, the number of sensing modules is known. In carrying through with the present example, N sensing modules are used. The method allows the detection of the location of each battery and sensing module in the string and assigns a unique address to each sensing module and battery to allow for better diagnostics and control of the battery string. As will be described below, because the addresses are sequentially assigned by the controller, the location of each is known.

The module identification process is initiated by controller 24 issuing a module sequence start command to all the sensing modules in the battery string 12. Each of the sensing modules set their respective sequence output to a default state. In the present example, each of the sequencing outputs are placed in a high state. Of course, any suitable state may be implanted as would be evident to those in the art. All the sensing modules also erase their current addresses stored within current address memory 36. Each sensing module then receives an identical address to check, and an input sequence signature type. Initially this corresponds to the first location.

Initially, the first sensing module SM 1 must be identified. As described above, the first sensing module SM 1 has its sequencing input SI 1 coupled to the negative battery terminal B−. The sequencing output state is set to a default high state for each of the sensing modules. Thus, each sequencing input for all the other modules will see a high state. The exception of course is sequencing module 1 whose sequencing input is pulled to a low state. Those skilled in the art would recognize that the unique input required for sense module 1 could also come from the controller. The controller sends a request to each sensing module to inquire what the particular state of each sequencing input is. The controller request is seeking to find the sensing module with a low sequencing input in this example. Because sensing module 1 has the only sequencing input that is low, the sensing module latches the address and thus stores the address within the address memory 36. An acknowledge signal may be provided to controller 24 to indicate successful identification of the first sensing module and to allow the controller 24 to continue sequencing. The controller thus has the first address and sensing module identified. During this process the communication between the sensing module and the controller takes place between the microprocessor 30 of each sensing module and the controller 24.

The controller 24 must then identify each subsequent sensing module. Each of the unknown sensing units will again receive an identical address to check, and a specific second sequencing input signature type. This address corresponds to the second location. The signature type for the second and subsequent sensing modules may be a toggling input or other input different from the first signature type. The toggling input may be generated by the microprocessor controlled switch 32. However, various types of signatures may be used. Preferably, the type of signature is one that noise or an error cannot easily produce. The controller 24 instructs each of the remaining sensing modules to look for a toggling input at the sequencing input. The controller instructs the first known module, in this case sensing module 1, to toggle its sequencing output. The controller 24 instructs the module with the toggling input to latch its address. Thus, sensing module SM2 will latch the second address because the signature of its sequencing input matches that which the controller 24 is requesting. The second sensing module acknowledges the known address as its own to controller 24.

A third address is then communicated to the remaining unidentified modules. The controller will then tell sensing module SM 2 to apply a signature such as a toggling signal to its sequencing output. In this manner, each of the remaining sensing modules are identified. Because the number of modules are known, all modules will be identified in a similar manner.

At the end of the process controller 24 may command all sensing modules to default their sequencing output to a particular state. For example, the sensing modules may all be defaulted to a high or a low signal.

Once the sensing modules and their relative locations are known, the controller 24 may be used to monitor the charging and discharging functions of the batteries through each of the associated sensing modules. If a fault is recognized in any one of the sensing modules or associated batteries, one of the interfaces or both of the interfaces such as display 18 or connector 20 may provide an indication as to which sensing module is indicating an error. This will allow a service technician to easily locate the suspect battery and sensing module.

If only one of the sensing modules is replaced, the controller 24 need not re-identify each of the sensing modules. Controller 24 issues commands and receives information about the sensing module's associated battery. Controller 24 keeps track of the commands initiated and if a particular sensing module has not responded in a predetermined number of tries, controller 24 will know that a sensing module and battery has been replaced or has a fault. Controller 24 may then command the non-responsive sensing module because of its known relative location to accept the address provided which is associated with its relative location.

While particular embodiments of the invention have been shown and described, numerous variations alternate embodiments will occur to those skilled in the art. Accordingly, it is intended that the invention be limited only in terms of the appended claims.

What is claimed is:

1. A distributed battery control network for a battery string having a plurality of batteries comprising:
    a plurality of sensing modules coupled in series, each of said plurality of sensing modules associated with a respective one of said plurality of batteries, each sensing module having a respective sequencing input and a sequencing output, said sequencing output coupled to an adjacent sequencing input;
    a network coupled to each of said plurality of sensing modules; and
    a controller coupled to said bus and communicating with each of said plurality of sensing modules, said controller loading each of said plurality of sensing modules with an address and a signature type,
    said controller determining which of said plurality of modules has a sequencing input with a predetermined signature type, storing said address in a particular one of said plurality of modules with said sequencing input equal to said signature type, and generating an identifying signature at an output of said particular one of said plurality of modules with said sequencing input equal to said signature type.

2. A distributed battery control network as recited in claim 1 wherein said address corresponds to a location.

3. A distributed battery control network as recited in claim 1 wherein said plurality of sensing modules having at least a first module, said first module having said sequencing input coupled to a negative battery terminal of said battery string.

4. A distributed battery control network as recited in claim 1 wherein each of said plurality of sensing modules comprises a voltage input terminal coupled to a respective battery and a ground terminal coupled to a respective battery.

5. A distributed battery control network as recited in claim 1 further comprising an interface.

6. A distributed battery control network as recited in claim 5 wherein said interface is selected from the group of a connector and a display.

7. A method for identifying batteries in a distributed control network comprises the steps of:
    providing a string of a predetermined number of batteries having said predetermined number of sensing modules associated therewith, each battery having a respective sensing module;
    determining the relative location of each battery and sensing module within the string; and
    assigning a unique address to each sensing module.

8. A method as recited in claim 7 further comprising the step of determining the non-responsiveness of a sensing module and assigning the sensing module an address based upon the relative location of said sensing module.

9. A method as recited in claim 7 wherein said step of providing comprises the step of providing each sensing module with a sequencing input and a sequencing output.

10. A method as recited in claim 7 wherein the step of determining comprises the steps of loading each of said plurality of sensing modules with an address and a signature type;
    reading the sequencing input of each of said sensing modules;
    determining which of said plurality modules has sequencing input with said signature type;

storing said address in a particular one of said plurality modules with said sequencing input equal to said signature type; and generating an identifying signature at an output of said particular one of plurality modules with said sequencing input equal to said signature type.

11. A method for determining a relative position of each battery and sensing module assembly in a battery string having a plurality of sensing modules comprising the steps of;

initializing said plurality of sensing modules;

loading each of said plurality of sensing modules with an address and a signature type;

reading the sequencing input of each of said sensing modules;

determining which of said plurality modules has a sequencing input with said signature type;

storing said address in a particular one of said plurality of modules with said sequencing input equal to said signature type;

generating an identifying signature at an output of said particular one of said plurality of modules with said sequencing input equal to said signature type;

repeating steps (B) through (F) until each of said plurality of sensing modules is identified.

12. A method as recited in claim 11 further comprising the step of (H) setting a sequencing output to a default value.

13. A method as recited in claim 11 wherein the step of storing comprises the step of acknowledging to a controller the storing of said address.

14. A method as recited in claim 11 wherein said step of loading comprises loading each of said plurality of sensing modules with an address corresponding to a location within said battery string.

15. A method as recited in claim 11 wherein the step of generating an identifying signature at an output comprises generating a toggling output.

16. A method as recited in claim 11 wherein during a first execution of step (B) said signature type is a logic low state.

17. A method as recited in claim 11 wherein the step of initializing comprises the step of erasing a current address.

18. A method as recited in claim 11 wherein the step of initializing comprises the step of setting each of a plurality of sequencing outputs to a default output.

19. A method as recited in claim 11 further comprising issuing an acknowledge signal in response to the step of storing said address.

20. A method as recited in claim 11 retrying to communicate with said controller if a response from a sensing module is not received.

* * * * *

UNITED STATES PATENT AND TRADEMARK OFFICE
CERTIFICATE OF CORRECTION

PATENT NO.     : 6,442,494 B1
DATED          : August 27, 2002
INVENTOR(S)    : Arvin Baalu et al.

It is certified that error appears in the above-identified patent and that said Letters Patent is hereby corrected as shown below:

<u>Title page,</u>
Item [73], Assignee should read as follows:

-- [73] Assignee: Visteon Global Technologies, Inc.
Residence: Dearborn, MI --

Signed and Sealed this

Seventh Day of January, 2003

JAMES E. ROGAN
*Director of the United States Patent and Trademark Office*